United States Patent
An

(10) Patent No.: US 7,120,071 B2
(45) Date of Patent: Oct. 10, 2006

(54) TEST METHOD FOR A SEMICONDUCTOR MEMORY

(75) Inventor: Jun Kwon An, Gyunggi-Do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/032,915

(22) Filed: Jan. 11, 2005

(65) Prior Publication Data

US 2005/0232040 A1    Oct. 20, 2005

(30) Foreign Application Priority Data

Apr. 16, 2004    (KR) .................... 10-2004-0026043

(51) Int. Cl.
*G11C 29/00* (2006.01)
*G11C 29/26* (2006.01)
*G11C 29/46* (2006.01)
*G11C 8/12* (2006.01)
*G11C 7/00* (2006.01)
*G11C 29/24* (2006.01)

(52) U.S. Cl. .................. 365/201; 365/230.03; 365/200

(58) Field of Classification Search ................ 365/201, 365/230.03, 149, 150, 200

See application file for complete search history.

(56) References Cited

U.S. PATENT DOCUMENTS

| 5,216,678 | A | | 6/1993 | Nawaki | |
|---|---|---|---|---|---|
| 5,307,316 | A | * | 4/1994 | Takemae | .................... 365/200 |
| 5,339,273 | A | * | 8/1994 | Taguchi | .................... 365/201 |
| 5,469,394 | A | | 11/1995 | Kumakura et al. | |
| 5,610,867 | A | | 3/1997 | DeBrosse et al. | |
| 6,167,541 | A | * | 12/2000 | Siek et al. | .................. 714/719 |
| 6,480,433 | B1 | * | 11/2002 | Huffman | .................... 365/201 |

* cited by examiner

*Primary Examiner*—Richard Elms
*Assistant Examiner*—J. H. Hur
(74) *Attorney, Agent, or Firm*—Marshall, Gerstein & Borun LLP

(57) ABSTRACT

A testing method for a semiconductor memory includes the steps of storing data in each of a plurality of memory cell blocks, electrically connecting two memory cell blocks with a sense amplifier shared by the two memory cell blocks of the plurality of memory cell blocks, sensing data of the two memory cells through the sense amplifier and determining whether the sensed data is normal based on a bit line capacitance increase according to the connection of the two memory cell blocks. The testing method can intentionally reduce an offset margin of a memory cell through increase of bit line capacitance, remove and screen an abnormal memory cell having a smaller capacitance and effectively decrease testing time.

4 Claims, 3 Drawing Sheets

TEST METHOD FOR A SEMICONDUCTOR MEMORY

This application relies for priority upon Korean Patent Application No. 2004-26043 filed on Apr. 16, 2004, the contents of which are herein incorporated by reference in their entirety.

BACKGROUND

1. Technical Field

The present patent relates to a test method for a semiconductor memory, and more particularly to a test method for detecting defects of a cell capacitor capacitance of a particular block in a semiconductor memory sharing a sense amplifier.

2. Description of the Related Art

Generally, a memory cell included in a semiconductor memory has capacitors and transistors each of which perform switching control between a capacitor and bit lines.

After manufacturing the semiconductor memory, a test for the semiconductor memory is performed such that data is recorded in each memory cell forming a block, which hereinafter is referred to as a memory cell block, and the recorded data read from the same memory cell block to check the state of the memory cell block.

The recorded data in the memory cell block is sensed by a sense amplifier commonly connected to the bit lines of two memory cell blocks. The sense amplifier amplifies the electric potential difference between electric potentials of (recorded) data output through a pair of bit lines over a predetermined voltage value. Here, if the electric potential difference between electric potentials of (recorded) data output through the two bit lines is less than a sensing margin, the recorded data may not be correct such that an error occurs.

When the semiconductor memory is manufactured such that a memory cell therein has its capacitor capacitance less than a normal value due to various reasons, a sufficient sensing margin sensible in the sense amplifier cannot be secured. As such, when a memory cell having capacitor capacitance smaller than a normal value is detected, it must be replaced with an additional memory cell or screened before being sold on the market.

In order to test for defects of a memory cell block based on capacitor capacitance of the memory cell, the conventional test method senses only output data of one of two memory cell blocks through a sense amplifier, in which the two memory cell blocks share the sense amplifier. Namely, while one memory cell block is opened not to be connected to the sense amplifier, the output data of the other memory cell block connected to the sense amplifier is sensed and amplified by the sense amplifier.

However, even though the memory cell has a cell capacitance smaller than a normal value and is thus defective, the conventional testing method cannot effectively detect the defective memory cell, as long as it does not have any process defect.

Also, the conventional testing method cannot reduce the burden of test time, because test time for a semiconductor memory is gradually increased in semiconductor development and production.

SUMMARY

Therefore, the present patent provides a testing method for a semiconductor memory capable of increasing the test speed for the semiconductor memory and detecting a defective memory cell having processing defects and the like, even though the defective memory cell has an abnormally small capacitance which cannot be effectively detected by a conventional testing method.

The present patent also discloses a test method for a semiconductor memory having the steps of storing data in each of a plurality of memory cell blocks, electrically connecting two memory cell blocks with a sense amplifier shared by the two memory cell blocks of the plurality of memory cell blocks, sensing data of the two memory cells through the sense amplifier, and determining whether the sensed data is normal based on a bit line capacitance increase according to the connection of the two memory cell blocks.

BRIEF DESCRIPTION OF THE DRAWINGS

The above and other objects, feats and other advantages of the present invention will be more clearly understood from the following detailed description taken in conjunction with the accompanying drawings, in which.

DESCRIPTION OF VARIOUS EMBODIMENTS

With reference to the attached drawings, the disclosed embodiments are described in detailed below.

Figure 1:
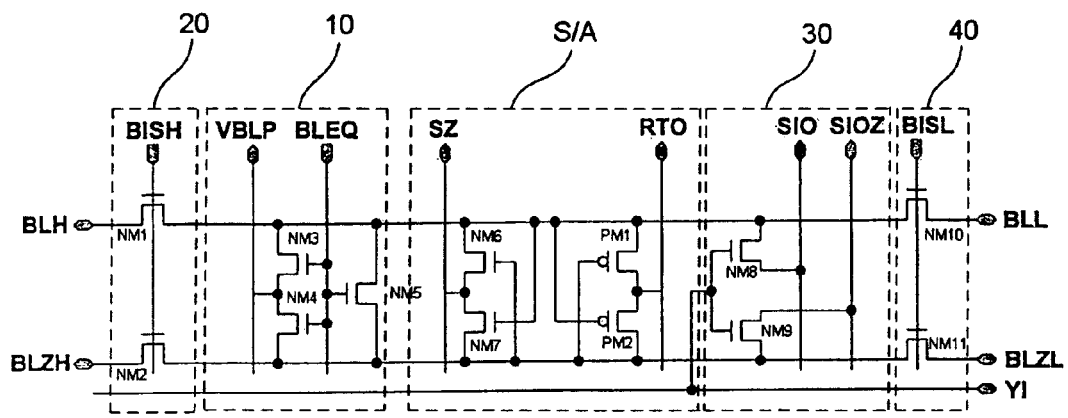
FIG. 1 is a view illustrating an exemplary embodiment of a circuit of a semiconductor memory.

FIG. 1 is a view illustrating a circuit of a semiconductor memory according to one embodiment which includes block selection units 20 and 40 for controlling a connection between the bit lines of each memory cell block and a sense amplifier S/A according to block selection signals BISH and BISL, an equalizing unit 10 for equalizing potentials of a pair of bit lines to identical potential VBPL according to a bit line equalizing signal BLEQ, and a data recording unit 30 for applying data to be stored in a particular memory cell block to the pair of bit lines.

In FIG. 1, NM1 to NM11 denote an N-MOS transistor and PM1 and PM2 stand for a P-MOS transistor. An exemplary configuration and operation of the semiconductor memory including a sense amplifier and peripheral circuits are described in detail below.

The exemplary test method serves to test a semiconductor memory including two memory cell blocks sharing a sense amplifier S/A as stat of signals supplied to the memory cell blocks is changed to simultaneously connect the two memory cell blocks to the sense amplifier. More specifically, data is recorded in a memory cell of each block through normal operations of the semiconductor memory. After that, for performing a test mode thereof, the block selection signals BISH and BISL are applied to the block selection units 20 and 40 with the same potential. Namely, the two memory cell blocks sharing the single sense amplifier are simultaneously selected.

When bock selection signals BISH and BISL are applied to the block selection units 20 and 40 with high potential, all the N-MOS transistors NM1, NM2, NM10 and NM11 thereof are turned on. In this state, bit line capacitance is increased compared to when only a single block is selected.

Table 1 below shows bit line and sense amplifier capacitances, respectively, cell capacitor capacitance and potential difference between voltages detected by the sense amplifier, in a normal operation state selecting one memory cell block.

TABLE 1

| BIT LINE CAPACITANCE | SENSE AMPLIFIER CAPACITANCE | CELL CAPACITOR CAPACITY | SENSE AMPLIFIER POTENTIAL DIFFERENCE |
|---|---|---|---|
| 90 fF | 20 fF | 20 fF | 0.138 V |
| 90 fF | 20 fF | 25 fF | 0.166 V |
| 90 fF | 20 fF | 30 fF | 0.192 V |

As described in Table 1, the capacitance of each bit line included in a memory cell block is 90 fF. Also, capacitances of the sense amplifier S/A itself is 20 fF. Therefore, the summation of the capacitances of each bit line and the sense amplifier S/A becomes 110 fF.

Under the above conditions, if cell capacitor capacitances are 20 fF, 25 fF and 30 fF, respectively, the potential differences between the pair of bit lines, sensed by the sense amplifier, are 0.138V, 0.166V and 0.192V, respectively.

Typically, when processes for the semiconductor memory are processed to obtain a cell capacitance of over 30 fF as a target value, the semiconductor memory having a cell capacitance of 25 fF in mass-production is included in a normal distribution. Therefore, in the semiconductor memory manufactured by such conditions, the sense amplifier can have a sufficient off-set margin in any case.

In the case that a cell capacitance of a memory cell is approximately 20 fF, the memory cell can be, generally, defective due to process defects therein. However, with respect to only an offset margin of a sense amplifier, the potential difference is sufficient to serve as the range of the offset margin. Meanwhile, a memory cell having a capacitance even less than 20 fF cannot effectively secure the offset margin of a sense amplifier S/A even in the testing mode of the present invention.

However, even if the above situation were real, if a process characteristic of such a cell memory was better than that of other memory cells at the time of testing, the conventional testing method could not effectively sense defects of the memory cell. Therefore, when subsequent processes such as "Burn In" occur, it may be detected as "fail" according to the aging of cell characteristic, later.

Also, in order to detect such a memory cell through a conventional technique, if stress accumulation time is applied thereto for a relatively long time, leakage current caused by other defects of a memory cell are simultaneously increased. Therefore, even if the memory cell is in a normal distribution, it might have "Over kill."

Table 2 below shows bit line and sense amplifier capacitances, cell capacitor capacitance and potential difference between voltages detected by a sense amplifier S/A. More specifically, it shows bit line capacitance increased according to a testing method proposed in the disclosed embodiments and relation of potential difference between a pair of bit lines according to the increase of the bit line capacitance, which is sensed by a sense amplifier S/A.

TABLE 2

| BIT LINE CAPACITANCE | SENSE AMPLIFIER CAPACITANCE | CELL CAPACITANCE | SENSE AMPLIFIER POTENTIAL DIFFERENCE |
|---|---|---|---|
| 180 fF(90 + 90) | 20 fF | 20 fF | 0.08 V |
| 180 fF | 20 fF | 25 fF | 0.1 V |
| 180 fF | 20 fF | 30 fF | 0.117 V |

As shown in Table 2, if in the testing mode two memory cell blocks sharing a sense amplifier S/A are electrically connected to the sense amplifier S/A at the same time to output data from the memory cell blocks, the bit line capacitance would have 180 fF, twice that of the capacitance thereof described in Table 1. Therefore, the summation of the bit line and sense amplifier S/A capacitances becomes 200 fF.

According to an increase of the capacitances, the voltage difference of the pair of bit lines are decreased to 0.08V, 0.1V and 0.17V, respectively, if cell capacitor capacitances are 20 fF, 25 fF and 30 fF, repectively.

The potential differences as described in Tables 1 and 2 are measured in core voltage of 1.8V. However, when cell capacitor capacitance has a normal value, the potential differences of the pair of bit lines are within a range satisfying sensing margin of the sense amplifier.

Namely, even if the two memory cell blocks sharing the sense amplifier are selected at the same time, charging voltage of a cell capacitor of a semiconductor memory normally manufactured to have over the normal capacitance outputs a voltage sensible in the sense amplifier S/A. Meanwhile, the charging voltage of a cell capacitor abnormally manufactured to have less than the normal capacitance is within a range which cannot be sensed by the sense amplifier S/A.

As such, based on selection of two memory cell blocks, increase of the capacitance from the selection and a sensing result of described data, state of a memory cell of each block is determined whether it is normal or abnormal.

Also, an exemplary memory testing principle serves to detect a defective cell such that, under the assumption that a minimum offset margin of a sense amplifier is 0.03V, a voltage difference, delta V, obtained as the defective cell is existed on a bit line is reduced to under 0.03V by abnormal current path of the defective cell. Here, testing time needs until a first delta V is reduced to under the offset margin of the sense amplifier as the abnormal current quantity of defective cell is controlled while the test is performed.

If the disclosed testing method is applied thereto, the first delta V is reduced to approximately half the voltage of the conventional method, and (test) time taken until the first delta V is reduced under offset margin of the sense amplifier by leakage current of a defective cell can be cut in half.

The above situation is correct for a cell capacitor having a capacitance of 20 fF as mentioned above. The potential difference of the cell capacitor itself is 0.08V over the offset margin of a sense amplifier. However, if the potential difference of a cell capacitor is measured under 0.03V less than the offset margin of a sense amplifier, which is caused by current leakage accompanied by defect reasons such as process defects, etc, a defect is detected in the memory cell.

In cases where the delta V is 0.117V and the minimum offset margin is 0.003V, the conventional technique needs testing time for current loss accumulation of approximately 0.114V. However, when a testing mode according to the disclosed embodiment is applied thereto, testing time caused by current loss such that delta V is approximately 0.005V (=0.008V−0.003V) can be reduced.

Also, if a memory cell having cell capacitance of about 20 fF has a smaller current loss than other cells, testing time caused by current loss is largely increased in the conventional method. Therefore, even normal memory cells in a normal distribution may cause 'Overkill' which is detected as a defect.

For these reasons, the conventional test method cannot detect defects of such a memory cell. Even though a defective cell is not removed or screened from the semiconductor memory in the testing process and the semiconductor memory with a potentially defective cell is processed by subsequent processes, the potential defect finally shows up as the defective cell is aged through successive processes. Because the disclosed testing mode does not detect defects using current loss accumulation but uses characteristics of bit line capacitance while a sense amplifier operates, the testing mode can detect defects in a relatively short time without 'Overkill.'

Figure 2:
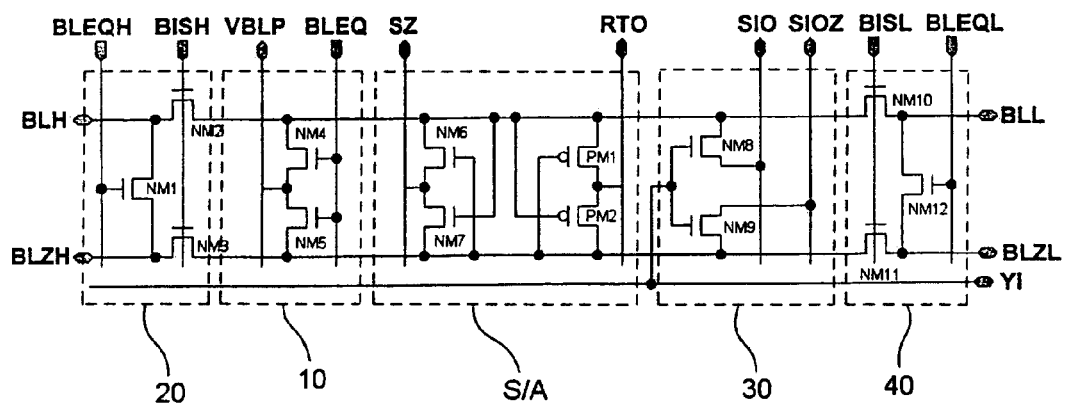
FIG. 2 is a view illustrating an alternative embodiment a circuit of a semiconductor memory according to another embodiment of the present invention.

FIG. 2 is a view illustrating a circuit of a semiconductor memory according to another exemplary embodiment, which is similar to the configuration of FIG. 1 except that the two memory cell blocks share a single sense amplifier. Namely, the circuit of a semiconductor memory includes a sense amplifier S/A, block selection units 20 and 40, an equalizing unit 10 and a data recording unit 30.

In a testing mode, when the circuit inputs block selection signals BISH and BISL in a high level potential and bitline equalizing signals BLEQ, BLEQH, and BLEQL in a low level potential, all the two memory cell blocks sharing the sense amplifier S/A are selected. According to the above operation, the bit line capacitance increases and resulting voltage difference of the data output from the memory cell blocks is decreased by 40% from the normal voltage.

However, even though a potential level of output data of the memory cell capacitor having a normal capacitance is decreased by 40% from the normal potential level, because the cell capacitor has a sufficient potential to be sensed by the sense amplifier, the cell capacitor is determined whether the cell capacitor has a normal capacitance or a capacitance there under. Namely, cell capacitors are classified as having a normal capacity or under normal capacity.

Figure 3:
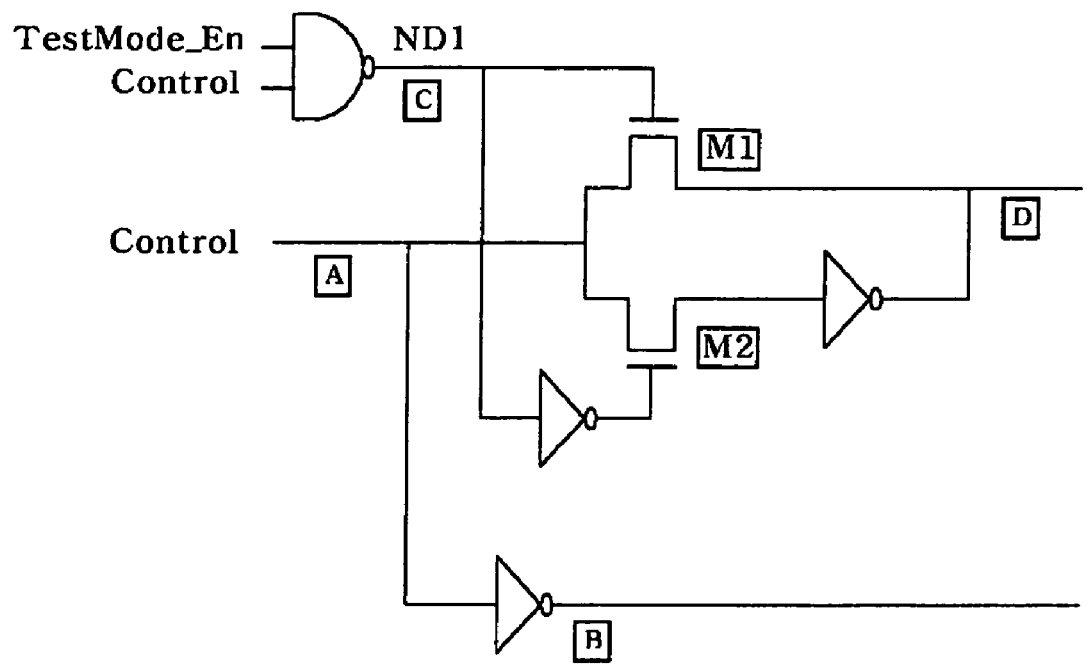
FIG. 3 is a view illustrating an exemplary embodiment of a circuit for generating block selection signals to be used in a testing mode.

FIG. 3 is a view illustrating a first exemplary embodiment of a circuit for generating block selection signals to be used in a test mode. Referring to FIG. 3, a method of generating block selection signals BISH and BISL is described in detail below.

As shown in the drawing, a logic level of the block selection signals BISH and BISL is determined depending on an input level of a test mode enable signal TestMode_En.

In a normal state wherein the testing mode enable the signal TestMode_En is a low level, the NAND gate ND1 outputs a high level and then the NMOS M1 is turned-on and NMOS M2 is turned-off A control signal, input to node A, for the block selection signals BISH and BISL is output from node D after passing through NMOS M1, and also output from node B after being inverted by an inverter. Namely, through the nodes D and B, the block selection signals BISH and BISL are output at the same time, in which the block selection signals BISH and BISL have different logic levels from each other.

In a test mode wherein the test mode enable signal TestMode_En is a high level, if a control signal CONTROL is a high level, the NAND gate ND1 outputs low level logic. Then the NMOS M1 is TURNED-ON and the NMOS M2 is TURNED-OFF. Therefore, the control signal of low level, input to node A, is output to node D after passing through NMOS M2 and an inverter as a low level, and also output from node B after being inverted by an inverter as a low level. Namely, through nodes D and B, the block selection signals BISH and BISL are output at the same time with the same low logic level. Therefore, in the testing mode of the disclosed embodiments, if the testing mode enable signal TestMode_En is input, because the block selection signals BISH and BISL are output at the same level, a pair of memory cell blocks can be simultaneously connected to a single sense amplifier.

Figure 4:
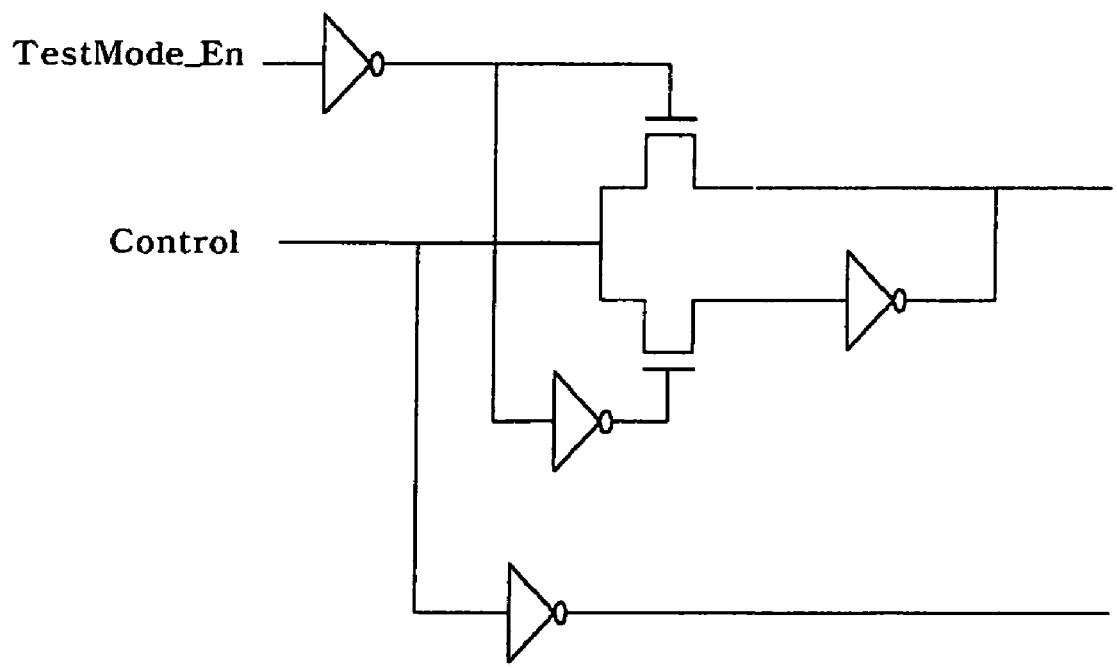
FIG. 4 is a view illustrating a second exemplary embodiment of a circuit for generating block selection signals to be used in a testing mode.
Figure 5:
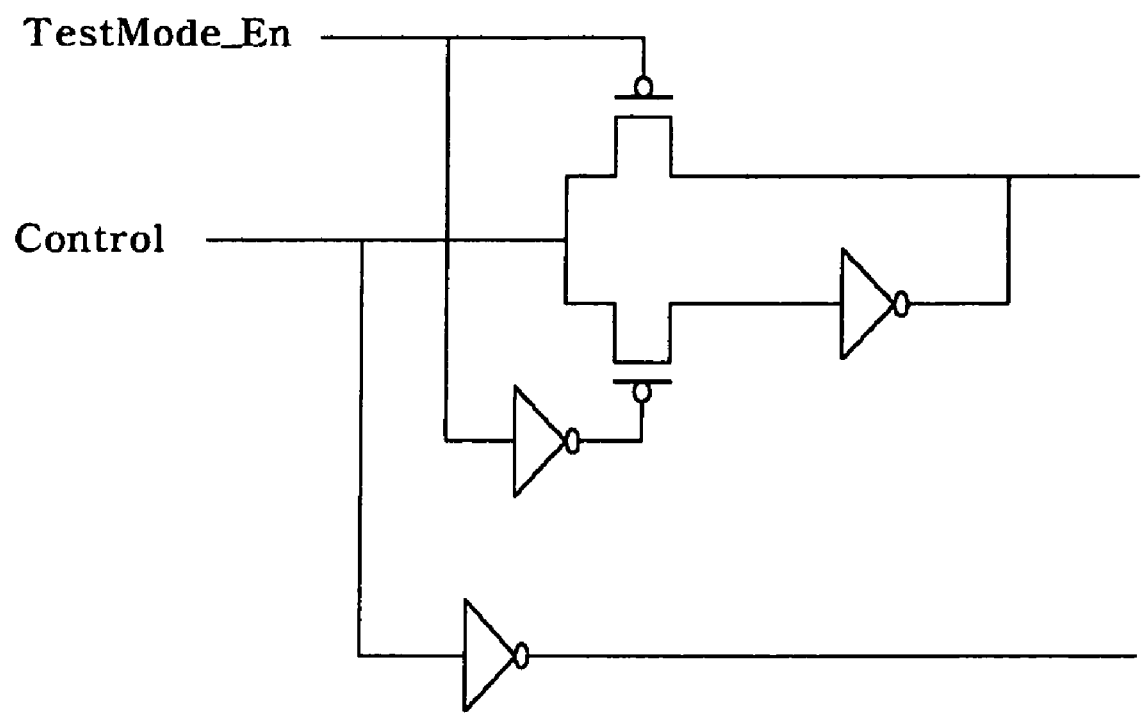
FIG. 5 is a view illustrating a third exemplary embodiment of a circuit for generating block selection signals to be used in a testing mode.

FIGS. 4 and 5 are views illustrating a second and third embodiment of an exemplary circuit for generating block selection signals to be used in a test mode, which operate to output the same logic level of the block selection signals BISH an BISL if a test mode enable signal TestMode_En is input thereto, like the embodiment of FIG. 3.

As apparent from the above description, the disclosed testing method can test a semiconductor memory including a single sense amplifier shared by two memory cell blocks in a testing mode wherein the two memory cell blocks are electrically connected to the sense amplifier, thereby improving test speed for the semiconductor memory.

Although the preferred embodiments of the present invention have been disclosed for illustrative purposes, those skilled in the art will appreciate that various modifications, additions and substitutions are possible, without departing from the scope and spit of the invention as disclosed in the accompanying claims.

What is claimed is:

1. A testing method for a semiconductor memory, comprising the steps of:

storing data in each of a plurality of memory cell blocks;

electrically connecting a first memory cell block with a sense amplifier in response to an enabled state of a first block selection signal and simultaneously electrically connecting a second memory cell block with the sense amplifier in response to an enabled state of a second block selection signal, the sense amplifier shared by the first memory cell block and the second memory cell block of the plurality of memory cell blocks;

sensing data of the two memory cell blocks through the sense amplifier; and determining whether the sensed data is normal based on a bit line capacitance increase according to the connection of the two memory cell blocks;

wherein the first and the second block selection signals are generated by a block selection signal generating circuit, the block selection signal generating circuit comprising:

a first transistor inputting a control signal from an input node and outputting the control signal as the first block selection signal in response to a disabled state of a test mode enable signal, a second transistor inputting the control signal from the input node and outputting the control signal in response to an enabled state of the test mode enable signal, a first inverter outputting an inverted signal of the output signal from the second transistor as the first block selection signal, and a second inverter outputting an inverted signal of the control signal from the input node as the second block selection signal.

2. The test method according to claim 1, further comprising determining that memory cell capacitor capacitance included in a corresponding memory cell block is abnormal if the determining step concludes that the sensed data is not normal, and replacing the memory cell block with a dummy memory cell block.

3. A testing method for a semiconductor memory, comprising the steps of:

storing data in each of a plurality of memory cell blocks;

electrically connecting a first memory cell block with a sense amplifier in response to an enabled state of a first block selection signal and simultaneously electrically connecting a second memory cell block with the sense amplifier in response to an enabled state of a second block selection signal, the sense amplifier shared by the first memory cell block and the second memory cell block of the plurality of memory cell blocks;

sensing data of the two memory cell blocks through the sense amplifier; and determining whether the sensed data is normal based on a bit line capacitance increase according to connection of the two memory cell blocks, wherein the first and the second block selection signals are generated by a block selection signal generating circuit, the block selection signal generating circuit comprising:

a logic unit for performing a logic operation on a control signal and a test mode enable signal and generating the logic operation result;

a first transistor inputting the control signal from an input node and outputting the control signal as the first block selection signal in response to the logic operation result;

a second transistor inputting the control signal from the input node and outputting the control signal in response to an inverted signal of the logic operation result;

a first inverter outputting an inverted signal of the output signal from the second transistor as the first block selection signal; and a second inverter outputting an inverted signal of the control signal from the input node as the second block selection signal.

4. The test method according to claim 3, wherein the logic unit is adapted to perform a NAND operation.

\* \* \* \* \*